United States Patent
Chappell et al.

(10) Patent No.: US 6,556,471 B2
(45) Date of Patent: Apr. 29, 2003

(54) VDD MODULATED SRAM FOR HIGHLY SCALED, HIGH PERFORMANCE CACHE

(75) Inventors: Barbara A. Chappell, Portland, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/893,236

(22) Filed: Jun. 27, 2001

(65) Prior Publication Data

US 2003/0012048 A1 Jan. 16, 2003

(51) Int. Cl.[7] .............................................. G11C 11/00
(52) U.S. Cl. .................. 365/154; 365/189.05; 365/203; 365/156
(58) Field of Search ................................. 365/154, 156, 365/205, 189.11, 189.05, 230.06, 203, 189.01

(56) References Cited

U.S. PATENT DOCUMENTS 6,005,795 A * 12/1999 Hawkins et al. ............ 365/156
6,292,418 B1 * 9/2001 Kawashima et al. ........ 365/203

* cited by examiner

Primary Examiner—David Lam
(74) Attorney, Agent, or Firm—Kenyon & Kenyon (57) ABSTRACT

The present invention provides a device and method for fast SRAM reading and writing. A boost voltage source is provided, wherein the boost voltage source operates to increase a conductance of a latch device in the SRAM cell relative to a conductance of an access device in the SRAM cell. By virtue of the increased relative conductance between the latch and access devices (beta ratio), the access device may be assume a wider width without jeopardizing the read stability of the cell.

15 Claims, 9 Drawing Sheets

VDD MODULATED SRAM FOR HIGHLY SCALED, HIGH PERFORMANCE CACHE

FIELD OF THE INVENTION

The present invention relates to the areas of digital circuits and digital logic. In particular, the present invention provides a method and device for high performance SRAM ("Static Random Access Memory") offering significantly higher read speed for the same cell area and technology relative to standard techniques.

BACKGROUND INFORMATION

Memory access speeds present a significant bottleneck in computer system performance. Modern computer systems typically utilize a hierarchical cached architecture in order to improve performance. In this hierarchy, fast but more expensive memory SRAM is located close to the CPU providing a cache for data and instructions while main memory is constructed from DRAM ("Dynamic Random Access Memory"), which provides density, but is typically much slower than SRAM. SRAMs are integrated circuits that are memory arrays with access ports that allow reading or writing. SRAMs have a fixed access time to any datum, though the read and write access characteristics often differ.

Even when instructions and data are cached using faster SRAM arrays, memory access instructions present a bottleneck. Depending upon the sequence of instructions, these bottlenecks may result in pipeline stalls and will generally significantly degrade performance especially as modern applications rely on frequent memory access.

SRAM cell power delay area product has not scaled commensurate to that for logic. The SRAM non-scaling problem presents a significant issue to the SRAM designer. Over the last few generations, the multiple effects of scaling of device horizontal and vertical dimensions and the associated adjustments of the device engineering and power-supply levels has resulted in faster devices, but not in higher saturation currents. SRAM speed depends on small-signal slew-rate (i.e., the saturation current of the device with respect to bitline capacitance). Bitline capacitances have benefited from scaling but, in particular the wire capacitance component (generally at least half of the bitline capacitance load) has not scaled at the same rate as logic speeds. The voltage that must be developed on the bitlines also has not scaled at the same rate as logic and these requisite voltages are generally not scaling or are in fact increasing in present and future technologies due to tolerances and parameter matchings, which tend not to scale.

The non-scaling problem has been addressed via architectural work-arounds for cache and register macros. However the extra logic and bypass paths needed to support these architectures are expensive. Adding increasing layers of logic becomes an intractable problem. Another attempt to deal with the non-scaling problem has been to reduce the number of cells per bitline pair. However, this approach is also very expensive in terms of increased area and power for the peripheral circuitry and exploitation of this strategy has reached practical limits. Other strategies for dealing with the non-scaling problem are also reaching their limits such as providing increased sense-amplifier performance (through increasingly complex sense-amplifier design), local amplification and aggressive clocking and pipelining methods.

In addition, leakage and other power concerns are becoming a severe problem due to the large increase of on-chip cache size that is being predicted for future high performance microprocessors. There is reason to anticipate that the SRAM non-scaling problem will continue to plague SRAM design for the foreseeable future. Thus, new techniques for addressing the non-scaling problem are necessary.

DETAILED DESCRIPTION

The present invention provides an SRAM cell design and associated clocking strategy and method to address the non-scaling problem (herein referred to as "the VDM design"). The VDD modulated SRAM design offers significantly higher read speed for the same cell area and technology relative to standard techniques for SRAM designs. The VDM design can be applied to allow higher thresholds that maintain low standby leakage currents expected of CMOS ("Complementary Metal Oxide Semiconductor") cells, while minimizing degradation in access speeds and in cell density due to the higher thresholds. Alternatively, the VDM design can be applied to reduce cell area while maintaining speed. Additionally, the VDM design can permit improved p-device hold-integrity to the cell high voltage without degrading the write time or increasing cell area.

The VDM design utilizes modulation of the VDD voltage applied to the cell in conjunction with cell design and operation methods and may be applied to standard CMOS cell configurations. In particular, the VDM design utilizes both re-designed device sizes and a boost voltage (VDB) to contain speed degradation while meeting requirements of read stability. In the VDM SRAM cell, as in standard cells, read stability is determined by the conductance ratio (beta ratio) of the access device to the latch device. The VDM design utilizes a boost voltage (VDB), which is applied to the pull-up devices of the latch resulting in an internal voltage stepping-up on the latch device, thereby increasing its effective conductance (i.e., increasing the effective beta ratio). By comparison, in standard cell designs, the cell beta ratio may be increased by enlarging the width of the latch device or decreasing the length of the access device. The former increases area and the latter increases wordline capacitance.

The VDM design avoids both of these problems. In particular, in the VDM design, the voltage boost increases the cell beta ratio without an associated drawback of increased capacitance or area. The effective beta ratio for the VDM cell and the standard cell must be of the same order in order to achieve the same read stability. However, in the VDM design, the access device can be made wider (and therefore have faster read access time) because the VDM boost voltage during read is translated to the internal cell high node through the conducting pull-up device. The higher cell voltage increases the conductance of the latch pull-down device relative to the access device, so as to keep the internal low node voltage from rising too high while discharging the bitline (thereby achieving read stability and avoiding the possibility of flipping the cell).

According to one embodiment of the present invention, the VDB voltage is provided utilizing a modulation technique achieved through a clocking strategy wherein the voltage from the power supply rail to the pull-up device is maintained at VDD and modulated to VDB just before a read operation. The device thresholds and sizes are set so that at the lower level (VDD) leakage currents are adequately low, but the boosted level during read permits a larger access device width relative to latch device width for faster read signal development as compared to a non-VDM cell design.

The VDM technique may also be applied to increase the speed of write operations in SRAM cells. According to one embodiment of the present invention, the VDM voltage is provided utilizing a modulation technique achieved through a clocking strategy wherein the voltage from the power supply rail to the pull-up device is maintained at lower voltage (VDW) during a write operation relative to it's standby storage (VDD). The device sizes and thresholds are then designed for sufficient write margin at the lower voltage and improved stand-by state storage reliability is obtained at the higher voltage. Write margin in a six-device SRAM cell is set by the ratio of device conductance of the access device relative to the p-device. Sufficient write margin can be obtained at the lower voltage with larger p-devices, because the reduced VDW voltage effectively decreases the p-device conductance relative to n-access-device conductance during a write operation. Storage reliability during a non-selected, standby state is provided by the p-device current supplied to the high cell node to offset leakage or voltage disturbances due to a soft-error event or other noise disturbances. Thus, enlarging the p-device relative to what is required for write-margin improves cell storage reliability.

The cell area cost for adjusting the size of the access or the p-device sizes in standard layouts is small, since the latch device is generally the area determining factor. Neither is there a wiring overhead in the array for use of a modulated VDD line versus the standard steady-state line. For example, according to a commonly used embodiment, a contact/via to the positive power-supply is shared among two or four adjacent cells, only one or two of which may be selected in at any one time. This standard area-conserving technique also may be used in the VDM cell wherein the positive supply line becomes the VDM line because the switching the VDM line does not disturb the stored state on cells with unselected wordlines.

According to one embodiment, a via from the cell to the VDM line may be shared among two or four adjacent cells because the VDB switching does not disturb the stored state on the unselected cell. Furthermore, the timing of the modulation from VDD to VDB or to VDW can be kept out of the critical path for wordline selection and write or read-signal-development by less deeply decoding the VDM line than the wordline. This will result in multiple VDM lines being selected relative to the number wordlines and is consistent with the read stability requirement that rows with selected wordlines also have VDM lines selected for switching to VDB. However, the VDM line is much more lightly loaded than a wordline and therefore the power cost is significantly lower.

Figure 1A:
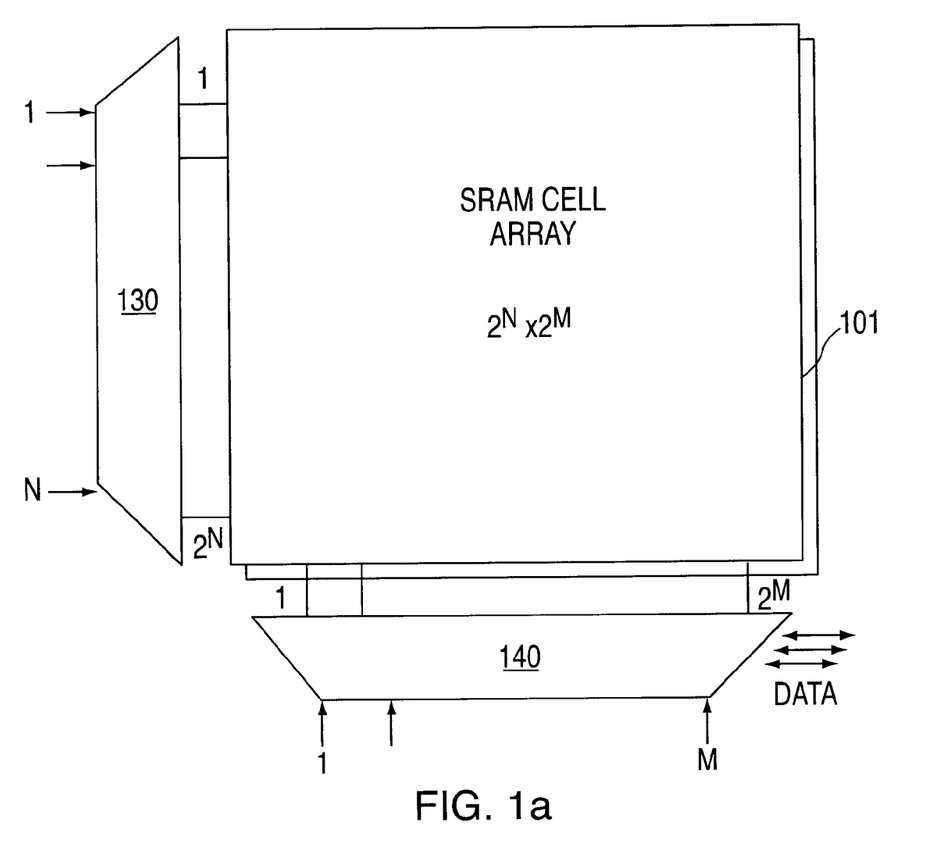
FIG. 1a is a block diagram that depicts an architecture of an SRAM array.

FIG. 1a is a block diagram that depicts an architecture of an SRAM array. SRAM array 101 stores information (e.g., data and instructions) in an array of $2^N$ rows and $2^M$ columns. Specifically, the SRAM array shown in FIG. 1a may store $2^N$ words of data, each word containing $2^M$ bits for a total of $2^{M+N}$ bits. Memory elements (bits) are accessed via row and column addresses, which are respectively received by row decoder 130 and column decoder 140 and decoded to select one or more bits.

Figure 1B:
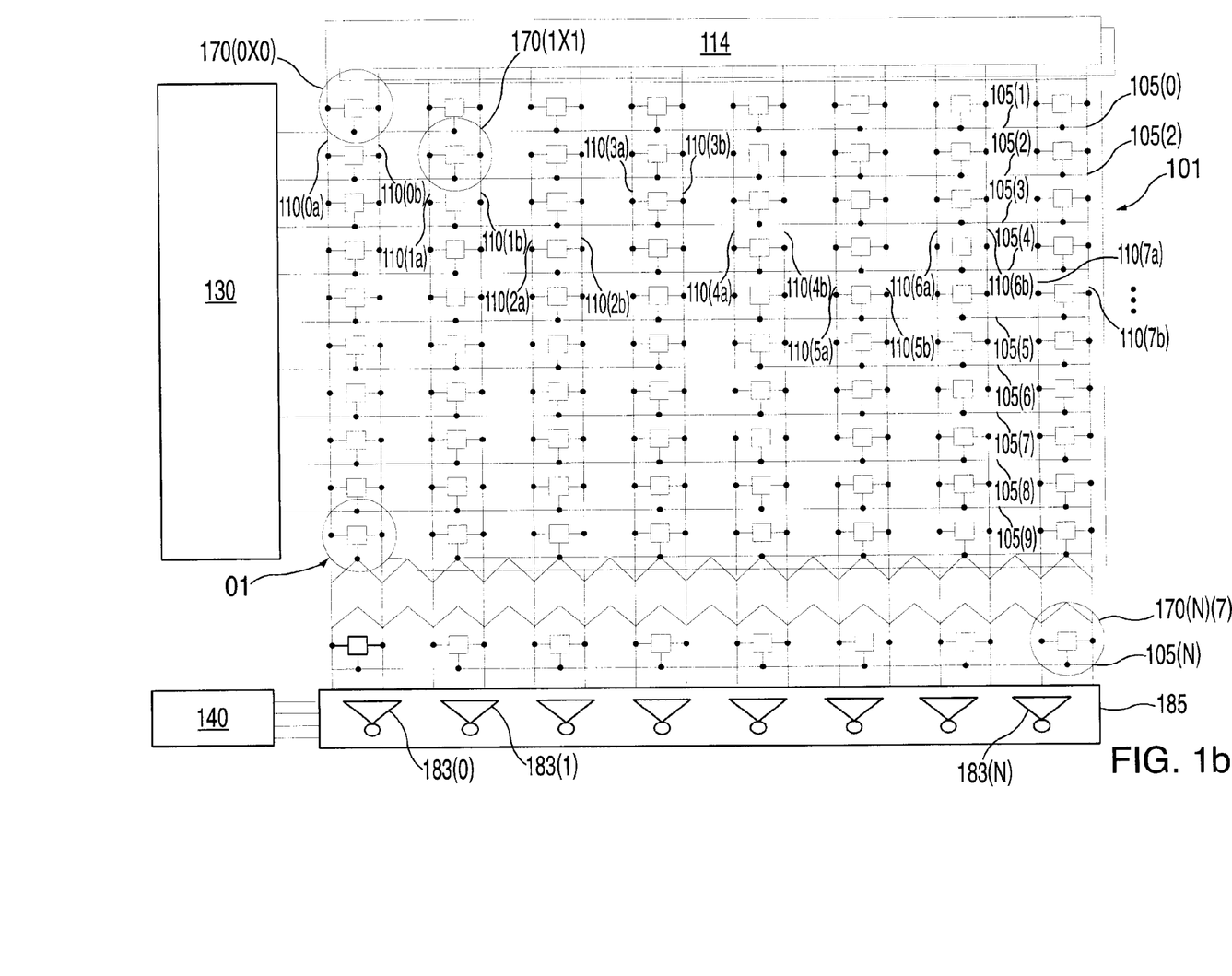
FIG. 1b is a more detailed block diagram that depicts an architecture of a conventional SRAM array.

FIG. 1b is a more detailed block diagram that depicts a portion of a conventional SRAM array architecture. SRAM array 101 includes a plurality of SRAM cells 170(1)(0)–170(N)(7), each storing one bit of information. Although FIG. 1a depicts a word length of 8 bits, an SRAM array 101 may store words of arbitrary length. The structure and operation of a conventional SRAM cell 170 is described below with reference to FIGS. 1c–1d.

Bit line conditioning block 114 coupled to SRAM array 101 performs operations for pre-charging bitlines 110(0a), 110(0b)–110(7a), 110(7b) during read operations as described below. Row decoder 130 coupled to SRAM array selects a particular wordline (105(0)–105(N)) from $2^N$ wordlines in SRAM array 101. Output block 185 coupled to SRAM array typically includes sense amplifiers 183(0)–187(0), for rapidly sensing and signaling voltage differentials on corresponding bitlines 110(0a), 110(0b)–110(7a), 110(7b). Output block 185 typically further includes column multiplexers and write buffer circuitry (not shown) for selecting one or more particular columns (bits) in a word for output.

Each SRAM cell 170(0)(0)–170(N)(7) is addressed and thereby read or written via a corresponding wordline 105(0)–105(N) and bitline pair 110(0a), 110(0b)–110(7a), 110(7b). Each member of a bitline pair (e.g., 110(0a), 110(0b)) respectively corresponds to bit and $\overline{\text{bit}}$. Thus, for example, SRAM cell 170(1)(1) is addressed via wordline 105(1) and bitlines 110(1a)-bit, 110(1b) bit. Bitlines pairs 110(0a), 110(0b)–110(7a), 110(7b) are typically run as complementary signals.

Row decoder 130 and column decoder 140 include digital logic circuitry (not shown) for respectively activating particular wordlines (e.g., 105(1)) and bitline pairs (e.g., 110(1a), 110(1b)) and thereby initiating read and write operations to particular SRAM cells 170(0)(0)–170(N)(7). Row decoder 130 includes digital logic circuitry for selecting one or more word lines 105(0)–105(N) to be asserted during a read or write operation. Column decoder/multiplexer 140 includes digital logic for selecting one or more columns (i.e., bitline pairs) in SRAM array 101 for input or output of data.

Figure 1C:
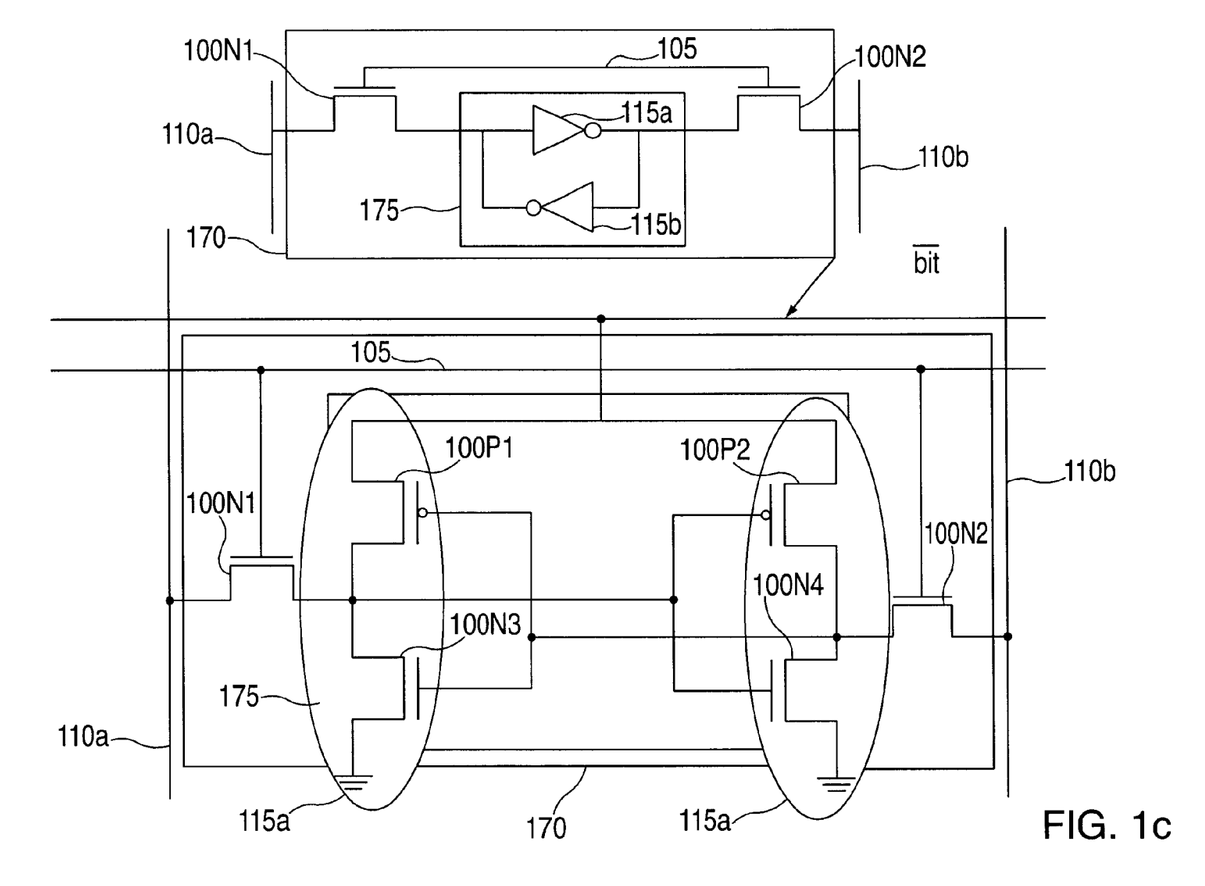
FIG. 1c is a gate level and transistor level depiction of a typical SRAM cell.

FIG. 1c is a block diagram that depicts a structure of a conventional SRAM cell. As shown in FIG. 1c, SRAM cell 170 includes access devices 100N1 and 100N2 and latch device 175. Access devices 100N1, 100N2 are typically MOS transistors, in this case NMOS transistors. Latch device is typically a cross-coupled inverter pair 115a, 115b. Latch device 175 stores a state of SRAM cell 170. Access devices 100N1, 100N2 provide a mechanism for reading and writing to SRAM cell 170 as described below.

Figure 1D:
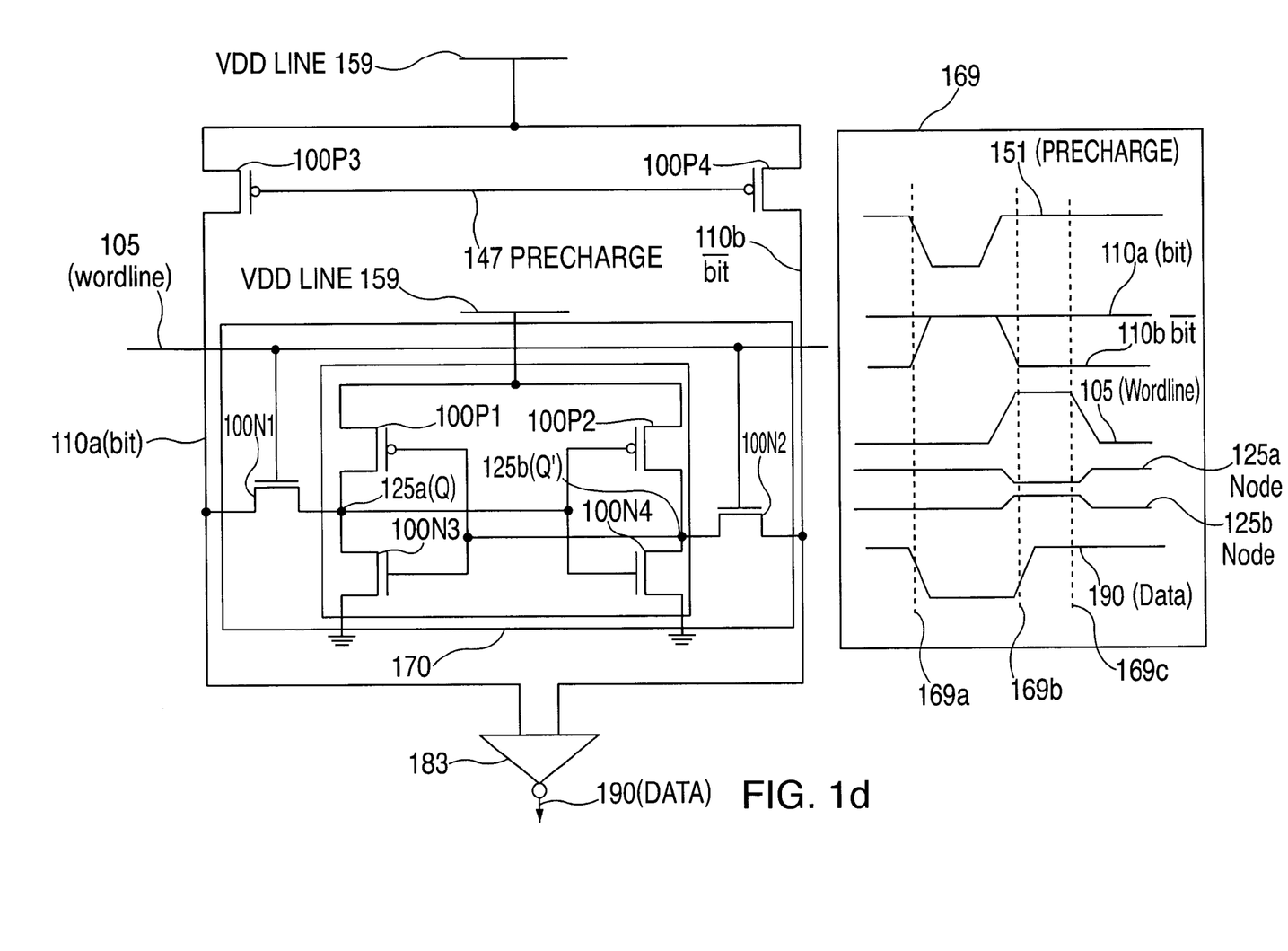
FIG. 1d depicts the operation of a standard SRAM cell with respect to a read operation.

FIG. 1d further depicts the operation of a standard SRAM cell with respect to a read operation. Bitlines 110a, 110b (bit and $\overline{\text{bit}}$ respectively) are coupled to precharge circuitry (i.e., 100P3, 100P4 and VDD line 159). For this example, it is assumed that SRAM cell 170 stores logical value '1' (i.e., node 125a (Q) is high and node 125b (Q') is low). During a correct read-event, the values stored in nodes 125a (Q) and 125b (Q') are transferred to bitlines 110a and 110b respectively. Assuming cell 170 stores a '1' (i.e., 125a (Q) is high), bitline 110a is retained at its precharged voltage and bitline 110b is discharged through transistors 100N2 and 100N4.

FIG. 1d also shows read timing diagram 169. At time 169a, precharge signal 151 is set low, turning on PMOS transistors 100P3 and 100P4, precharging bitlines 110a and 110b. At time 169b, wordline 105 is set high, turning on NMOS transistors 100N1 and 100N2. While wordline 105 is high, nodes 125a and 125b are respectively connected to bitlines 110a and 110b. Bitline 110b (bit) begins to discharge via access transistor 100N2 and latch transistor 100N4, which is turned on via high gate signal 125a. This current flow corresponding to voltage boost at node 125b. Meanwhile, bitline 110a begins to slightly discharge via access transistor 100N1, corresponding to voltage drop on node 125a. Sense amplifier 183 detects voltage differential between bitlines 110a and 110b generating high voltage ('1') 190 (data). At time 169c, wordline 105 goes low turning off access transistors 100N1 and 100N2.

Note that during the read operation the combination 100N2 and 100N4 forms a saturated load NMOS inverter. The dc value of node 125b (Q') as imposed by this inverter configuration must stay below the switching point of the inverter 100P2, 100N2. Otherwise, the cross-coupled inverter pair might be toggled destroying the value stored in the cell. Thus, it is necessary to maintain the conductance of transistor 100N5 larger than that of transistor 100N2 (beta ratio). In standard cell designs, the cell beta is asserted by increasing the width of the latch device (100N4) and decreasing the length of the access device 100N2. The former costs area and the latter costs wordline capacitance. The boundary conditions on the device sizes can be derived from solving the current equation at the switching threshold as follows:

$$\frac{k_{n,N2}}{2}\left(\frac{VDD}{2} - V_{tn}\left(\frac{VDD}{2}\right)\right)^2 = k_{n,N4}\left((VDB - |V_{tn}|)\frac{VDB}{2} - \frac{VDB^2}{8}\right)$$

where $k_n$ is the gain factor of a respective device and includes the process transconductance parameter $\mu_n C_{OX}$. Alternatively, $V_{MAX}$ for read stability can be expressed as $I_{READ} R_{ON}$, which is proportion to $Z_a Z_l$. The saturated access device sources the read current according to:

$$I_{READ} = I_{DS}(\text{access}) = K_a Z_a VOD_a^2$$

The resistance of the latch device for small VDS is effectively:

$$R_{on}(\text{latch}) = K_l Z_l VOD_a^2$$

where $K_a$ and $K_l$ are respective process conductance parameters for the access device and the latch device, $Z_a$ and $Z_l$ are respective width/length ratios for the access and latch devices, $VOD_a$ and $VOD_l$ are respective over-drive voltages for access and latch devices.

According to the present invention, the wordline voltage is not boosted as in conventional techniques, which is a problematic solution in that the capacitance of the wordline is large and it is in the critical path for a read operation. Instead, the effective resistance of the latch device is decreased by increased its gate voltage through the PMOS pullup device source following the boosted BDM value. To maintain $V_{MAX}$ at a constant value, the decrease in $R_{ON}$ may be traded for either an increase in $Z_a$ of the access device or a decrease in $Z_l$ of the latch device. An increase in $Z_a$ increases Iread and therefore decreases the time to discharge the bitline capacitance. A decrease in $Z_1$ reduces the cell area.

Figure 2:
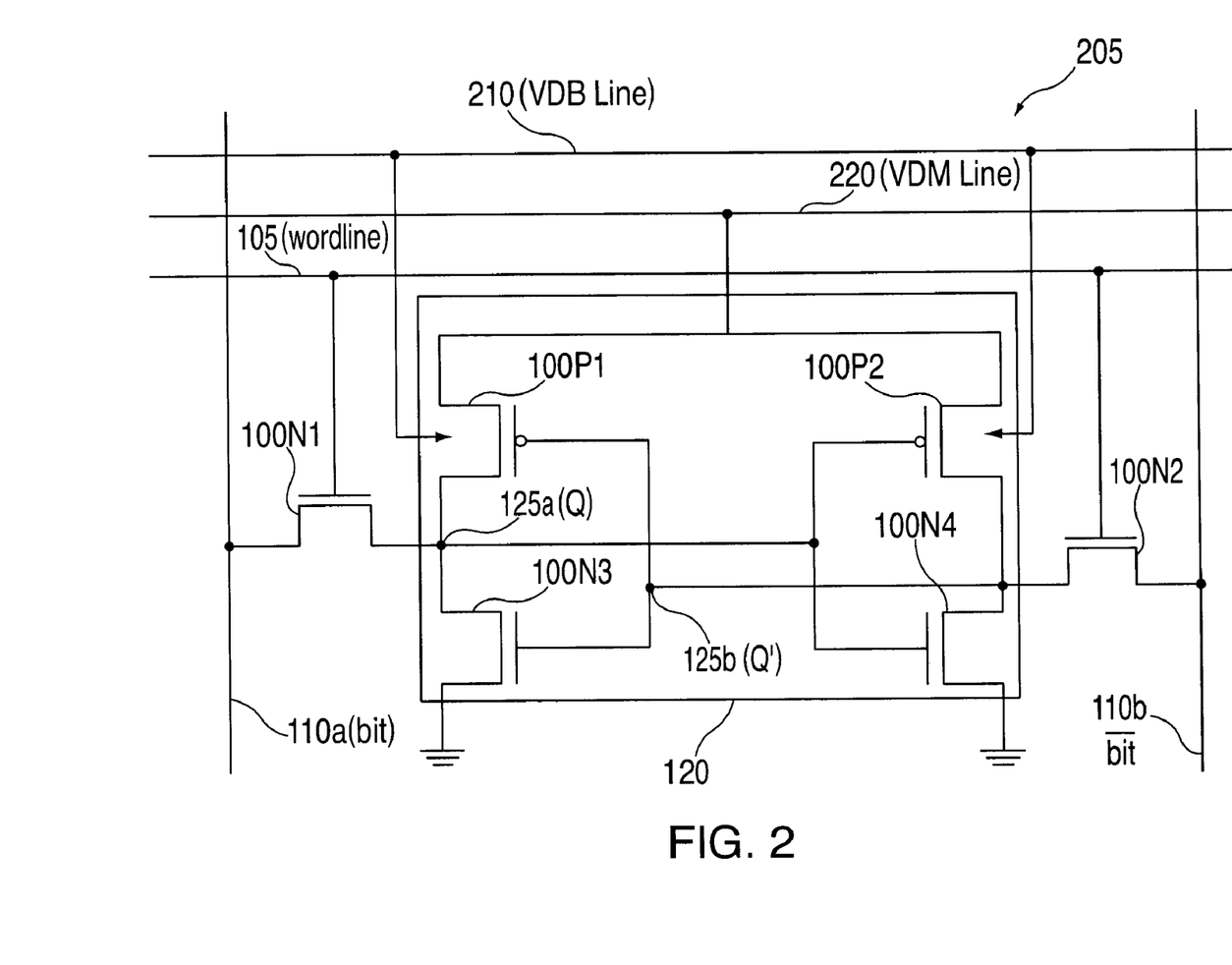
FIG. 2 is a transistor level diagram depicting the architecture of a VDM SRAM cell according to one embodiment of the present invention.

According to the present invention, access speed to an SRAM cell 170 is greatly improved while maintaining stability of the cell during access. FIG. 2 is a transistor level diagram depicting the architecture of a VDM SRAM cell according to one embodiment of the present invention. As shown in FIG. 2, the p-device power rail is coupled to VDM line 220. As described below, modulating voltage line 220 is modulated between the lower steady state value VDD and a boost voltage VDB during a read operation. Furthermore, the n-well enclosing PMOS transistors 100P1 and 100P2 is coupled to VDB line 210 providing the steady state boost voltage VDB. As will become evident as the invention is further described, use of the boost voltage VDB during a read operation allows the device thresholds and sizes to be configured so that at the lower level (VDD) leakage currents are adequately low, but the boosted level during read permits a larger access device width relative to latch device width (beta-ratio) for faster read signal development as compared to a non-VDM cell. In VDM SRAM cell 205, as in standard cells, the read stability is determined by the conductance (beta ratio) of the access device (100N1, 100N2) to the latch device (100P1, 100P2, 100N3, 100N4). Boosting the voltage (VDB) to PMOS devices 100P1 and 100P2 results in the internal voltage stepping-up on the latch device thereby increasing its effective conductance during a read operation.

Figure 3:
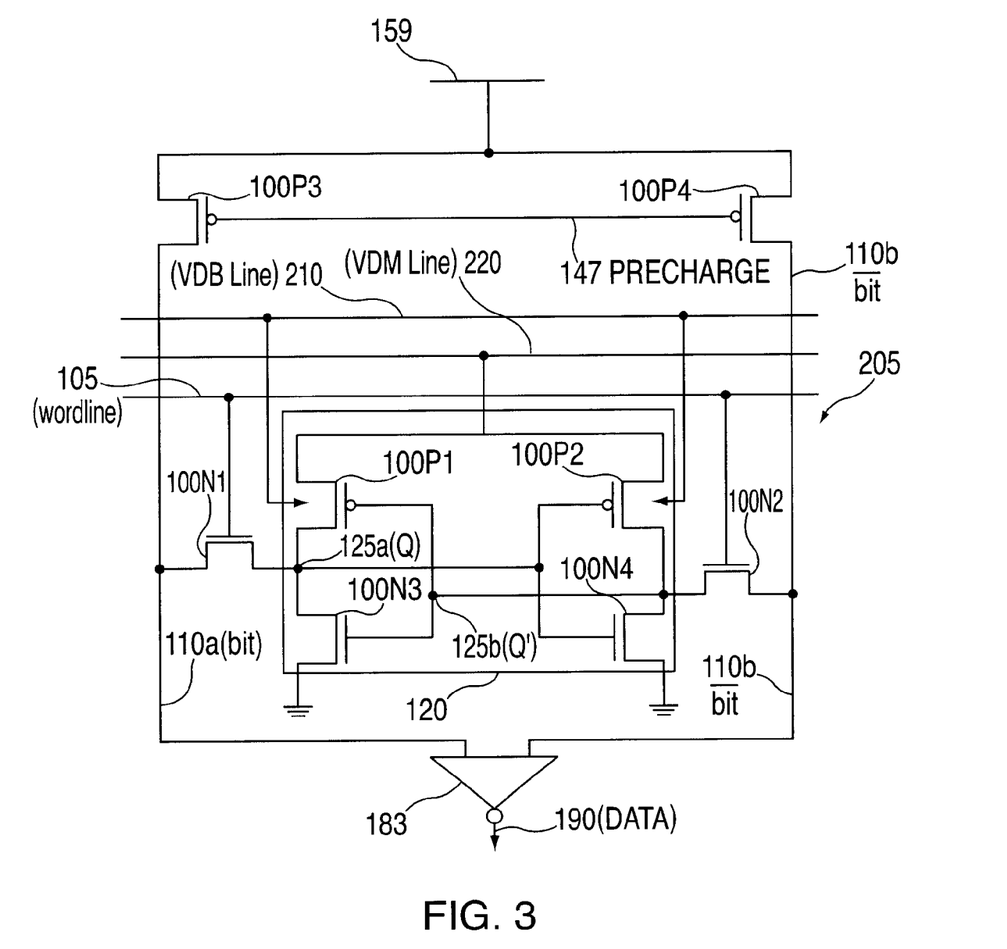
FIG. 3 depicts a VDM SRAM cell configured in a precharge arrangement.

FIG. 3 depicts a VDM SRAM cell configured in a precharge arrangement according to one embodiment of the present invention. As shown in FIG. 3, VDD source 169 is coupled to bitlines 110a and 110b via PMOS precharge transistors 100P3 and 100P4. Bitlines are also coupled to sense amplifier 183, which detects a voltage differential on bitlines 110a and 110b and provides data signal 190 as output.

Figure 4:
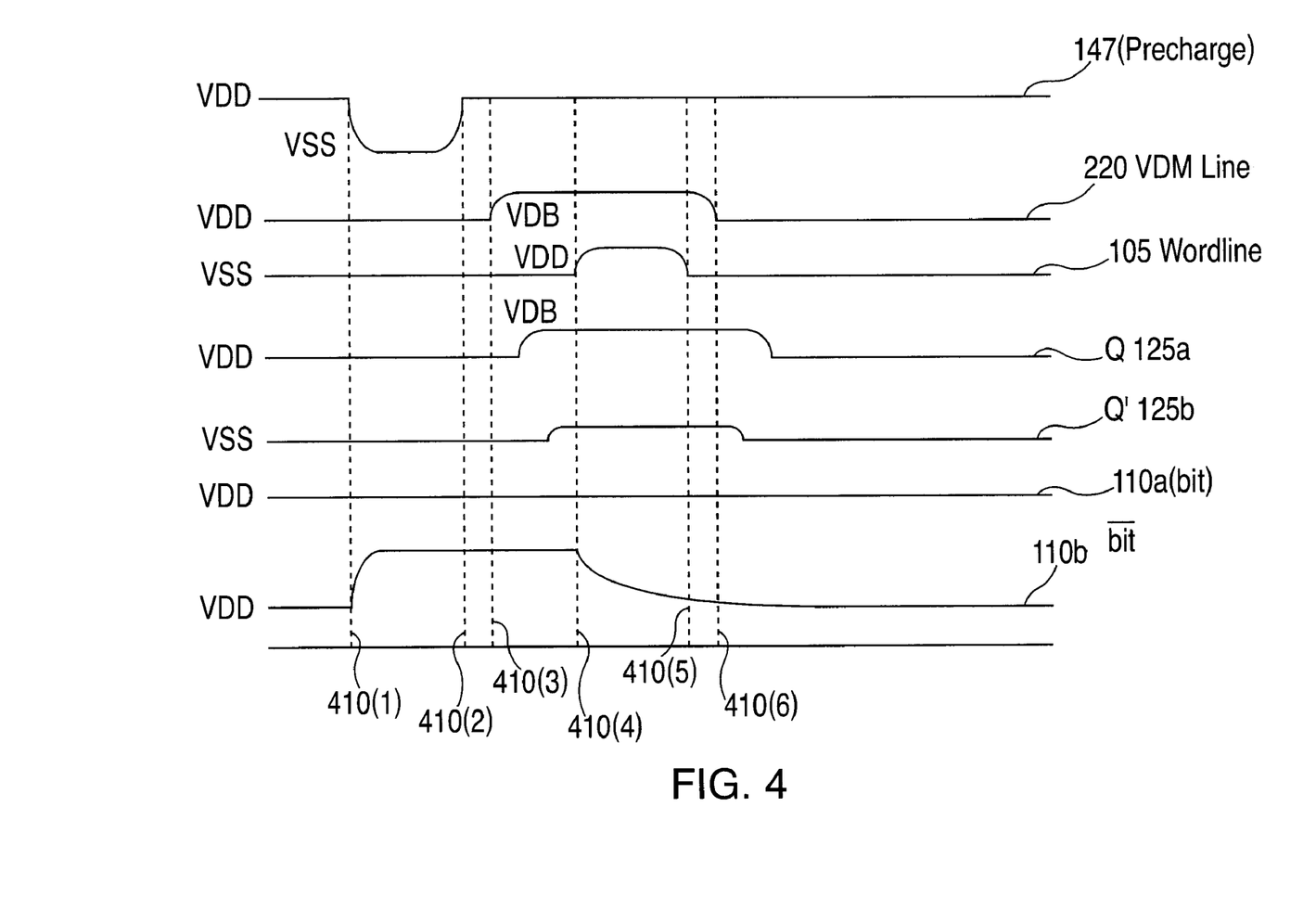
FIG. 4 illustrates an exemplary timing diagram for a VDM SRAM cell read operation according to one embodiment of the present invention.

FIG. 4 illustrates an exemplary timing diagram for a VDM SRAM cell read operation according to one embodiment of the present invention. For the purposes of this example, it is assumed that VDM cell 205 stores a logical 1 (i.e., node 125a is high and node 125b is low). Note that before a read operation VDM line 220 operates at voltage VDD. At time 410(1), precharge line 147 goes low turning on PMOS transistors 100P3 and 110P4, charging bitlines 110a and 110b. At time 410(2), precharge line 147 goes high, turning off PMOS transistors 100P3 and 100P4. At time 410(3), VDM line 220 is boosted from VDD to VDB, which raises voltage at node Q (125a) to VDB from VDD and begins to raise voltage at node Q' (125b) from VSS. The effect of the VDB boost is to increase the conductance of transistor 100N4. At time 410(4), wordline 105 goes high (from VSS to VDD) turning on access devices 100N1 and 100N2 and bitline 110b begins to discharge through access device 100N2 and 100N4. Sense amplifier 183 detects voltage differential between bitlines 110a and 110b and generates data 190 as a high ('1') signal.

Note that the boosted voltage level (VDB) need not be large in order to provide a significant increase in over-drive to the latch device. The relationship between VDB and VDD depends upon the oxide, leakage, threshold and reliability constraints of the technology and the delay/area design point of the cell. In highly scaled technologies, leakage and power concerns can limit the supply voltage to a smaller value than thin-oxide limits allow. Also, the highest voltage allowed for use on the logic has budgets for over-shoots on the drains and sources. The PMOS devices in the SRAM cell during a read operation do not experience this overshoot that occurs in logic and this budget can instead be used for VDB. In this case, the VDD level could be set equal to the chip supply (i.e., VCC) and the VDB level could be charged pumped above that.

Alternatively, the VDD level could be set below the chip voltage and VDB set equal to VCC allowing a threshold increase or channel length increase in order to reduce the standby leakage in the SRAM array. In this case, the VDM technique is leveraged to maintain the cache read speed despite the increase in thresholds or channel lengths.

Figure 5:
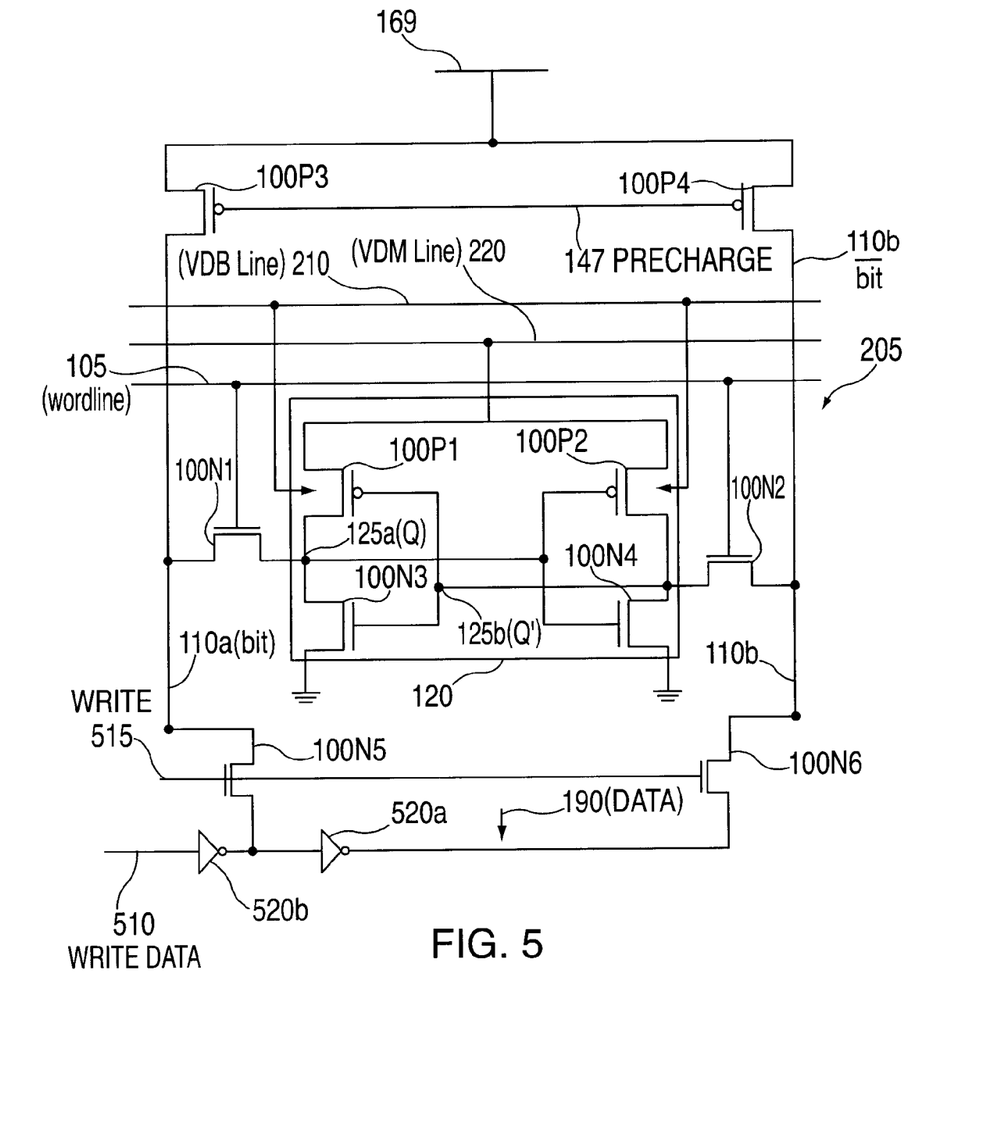
FIG. 5 depicts a VDM SRAM cell with additional circuitry for performing a write operation according to one embodiment of the present invention.

FIG. 5 depicts a VDM SRAM cell with additional circuitry for performing a write operation according to one embodiment of the present invention. The objective of the SRAM write operation is to apply voltages to the SRAM cell such that it will flip state. As shown in FIG. 5, write line 515 controls respective write enable transistors 100N5 and 100N6. Data arrives via write data line 510. The data and its respective compliment are generated via inverters 520a and 520b and are then written to SRAM cell 205 via bitlines 100a and 100b.

For the case of a write operation, the internal node may be boosted, kept at the standby voltage, or decreased, depending on the array configuration and the trade-offs in cell stability. The preferred embodiment is that the wordline be kept at the standby voltage or decreased for a write. However, it is not required and it may be incompatible with the array configuration The array configuration trade-offs for different applications are discussed below, after description of write-margin and storage reliability advantages of the VDM design.

Write margin design of a given CMOS six-device SRAM cell is determined by the ratio of the p-device to the n-access device and the reliability of the stored state is determined by the p-device conductance. Writing the cell requires discharging the high node of the cell through the access device to the bitline that is held low during a write. Initially, the n-access device must pull-down the internal node while the p-device is fully conducting. Once the internal node is pulled low enough, the p-device on the other side of the latch begins to pull-up the low node and turn-off the p-device on the side with the low bitline. Thus the latch changes state. Thus, the p-device size upper limit is bound by the write-margin requirements.

In the standby state, the conductance of the p-device is very important to retaining the stored state in the presence of a noise disturb. Leakage or noise—such as a highly energetic particle (for example, an alpha), power-supply noise or capacitive coupling—could act to discharge the internal high node and thereby switch the latch. Any discharge of the high node is offset by the current supplied by the p-device that is in the on-state. SRAM products are designed for storage reliability, for example in terms of errors per thousand hours. Thus, the lower-limit on the p-device size is bound by the storage-state reliability requirements.

In a VDM cell designed to have a larger access device to achieve, for example, read-access speed improvement, the write-margin/storage-reliability ratio (WSR) is unchanged if the VDM line must be high during a write but it can be improved if the VDM line can be at a lower voltage during a write. As already discussed for the latch device in the case of a read, the higher the VDM voltage, the more conductive is the p-device for a given size. There is no change in WRS in the case that VDM is boosted to the VDB level during both a read and a write because the n-access device Z is increased and the p-device Z is unchanged but its effective conductance is increased by the VDB level increase during a read. The storage-reliability is improved in the case that VDM is left at the standby voltage (VDD) by increasing the p-device Z until the write-margin bound is reached. Further improvement can be obtained by further decreasing the VDM line voltage during a write to some lower VDW and further increasing the p-device Z until the write-margin bound is reached.

In general, cell area cost for this storage reliability is negligible. Cell area for the p-device region is dominated by the structures for contacting them and small increases in p-device Z has no impact on cell area. Since the latch device must be larger than the access device and the access device must be larger than the p-device, the latch device becomes the dominator of cell area and the p-device is made as small as possible. For offsetting discharge currents due to noise, even small increases in p-device Z can have major improvement in storage reliability.

Some cost in write-time will be incurred in the VDM design but is small and write-time is generally much faster in SRAM products and is not a limiting specification. Increase in write-time occurs because modulating the VDM line during a read may not directly translate to a change in voltage on the internal cell node. Nevertheless, it will modulate the conductance of the p-device and have the above described effect on the WRS. If the VDM line voltage is stepped to a higher level, the internal cell node will follow it up with very little delay (if the wordline is low or if the bitline on that side of the cell is high). If the VDM line is stepped down in voltage, then the internal cell node will not follow that transition immediately. Assuming that the step in voltage is less than a the threshold of the p-device and that the body voltage (the n-well) is tied to the highest voltage, the p-device will cut-off until the internal cell node is pulled-down by leakage or by a noise disturbance to be at or slightly below the voltage of the VDM line. Then, the p-device will source current as needed to keep the internal cell node voltage level equal to that of the VDM line.

Thus, following a VDM pulse to VDB, a delta-voltage is dynamically stored and it is easily discharged by the n-access device into a low bitline during a write. The n-access device is designed to be conductive enough to overwhelm the current sourced by the p-device, which makes very fast to discharge this small voltage stored on a small capacitor. Therefore, discharging the dynamic delta-voltage has negligible impact on the write-time of the cell. That dynamically stored delta-voltage also is also not a reliable addition to the stored charge of the cell, but any increase in p-device Z enabled by the VDM cell design does enhance the reliability of a stored voltage equal to the stand-by voltage (VDD) on the VDM line. As described above, the cell-latch stability is designed relative to the VDD level.

Array configuration trades-off against the implementation of the VDM enhancement of storage-reliability. According to the afore-described VDM design techniques, for stable storage with a wordline high, the VDM line must be at VDB, whether the access be for the purpose of a read or a write. Thus, two array configuration choices trade-off against the write-operation choices in voltage:

1. An array may be configured so that only a sub-set of the columns along the row selected by a wordline is to be written or so that all the columns (the full word width) is to be written.
2. The VDM line may run parallel to the wordline or to the bitlines.

In the case of a sub-set of the columns being written, if the VDM line runs parallel to and is decoded along with the wordlines, the VDM line may need to be at VDB during a write and the ratio of p-device to n-device conductance would need to be designed accordingly. As described above, this does not incur any penalty but also does not improve storage reliability over the standard case.

Alternatively, the VDM line may be run parallel to and decoded the same as the bitlines, then the VDM line could level could be optimized separately for the write and the read operations and the above described storage reliability enhancements can be obtained.

However, in high speed SRAM cache applications, it is generally preferred to select all columns along a given wordline for a write operation. For speed without excessive power cost, the array is broken into sub-arrays that have only as many columns along the wordline as required to provide the needed word width from the cache (for example, a cache word or line of 128 bits). For this case, the VDM line may run parallel to the wordline and that may be the preferred choice for decode speed. Since all cells on a VDM line are being written at the same time, the above described storage reliability enhancements can be obtained.

If not all cells on a wordline are written at the same time, then protection of the stored state in half-selected cells would require the boost on the VDM lines associated with selected wordlines. Cache arrays, however, are sometimes configured for a write of all cells (e.g., on a line) on a wordline. In this case, there would be power and area savings in not boosting the internal node during a write, since less drive is necessary to overcome the stored state if the cell is not boosted.

Figure 6:
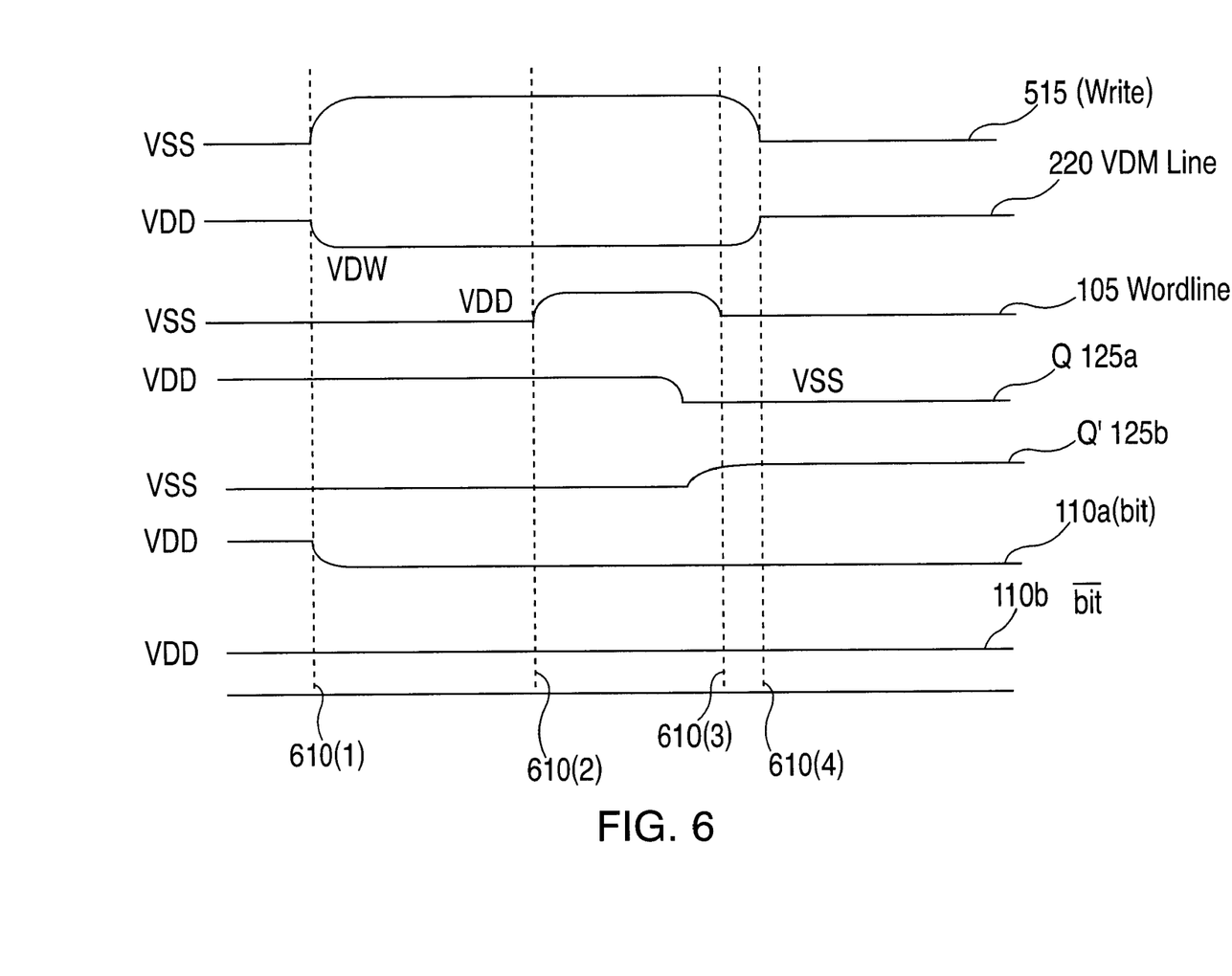
FIG. 6 illustrates an exemplary timing diagram for a VDM SRAM cell write operation according to one embodiment of the present invention.

FIG. 6 illustrates an exemplary timing diagram for a VDM SRAM cell write operation according to one embodiment of the present invention. It is assumed that bitlines 110a and 110b are precharged high prior to the write operation. According to this embodiment, VDM line 220 is modulated between VSS and a lower voltage VDW as described above. Modulating to a lower voltage VDW allows for an improved WSR for the cell. However, according to alternative embodiments, VDM line 220 may be boosted or retained at the standby voltage. At time 610(1) write line 515 goes high and VDM line 220 is modulated from VDD to a lower voltage VDW. At time 610(2), wordline 105 goes high (VDD). At time 610(3), wordline 105 begins to swing low. Prior to the time wordline 105 goes low, Q 125a begins to fall from VDD. Sometime thereafter, Q' 125b goes high and the cell has been written. Write line 515 and VDM line 220 are reset at time 610(4), the cell is ready for another read or write operation.

An SRAM cell design and associated clocking strategy and method to address the non-scaling problem has been described. The VDD modulated SRAM design offers significantly higher read speed for the same cell area and technology relative to standard techniques for SRAM designs. The VDM design can be applied to allow higher thresholds that maintain low standby leakage currents expected of CMOS ("Complementary Metal Oxide Semiconductor") cells, while minimizing degradation in access speeds and in cell density due to the higher thresholds.

What is claimed is:

1. An SRAM ("Static Random Access Memory") cell comprising:
   a latch device for storing a state of the SRAM cell;
   an access device for performing a read and write operation;
   a boost voltage source, wherein the boost voltage source is applied to the latch device, the boost voltage increasing a conductance of the latch device relative to a conductance of the access device.

2. The SRAM cell according to claim 1, wherein the latch device comprises a first inverter and a second inverter, the first inverter and second inverter configured in a cross-coupled arrangement.

3. The SRAM cell according to claim 2, wherein the each of the first inverter and second inverter includes a respective pull-up device and a pull-down device, the pull-up device operating to pull up a voltage at an output of a respective inverter and the pull-down device operating to pull down a voltage at an output of a respective inverter.

4. The SRAM cell according to claim 3, wherein the respective pull-up devices of the inverters are P-MOS transistors fabricated within at least one N well.

5. An SRAM ("Static Random Access Memory") cell comprising:
   a latch device for storing a state of the SRAM cell, the latch device comprising a first inverter and a second inverter, the first inverter and the second inverter configured in a cross-coupled arrangement, wherein each of the first inverter and second inverter includes a respective pull-up device and a pull-down device, the pull-up device operating to pull up a voltage at an output of a respective inverter and the pull-down device operating to pull down a voltage at an output of a respective inverter;
   an access device for performing a read and write operation;
   a boost voltage source, wherein the boost voltage source is applied to the latch device, the boost voltage increasing a conductance of the latch device relative to a conductance of the access device, wherein the boost voltage source is applied to the pull-up devices of the first and second inverters prior to one of a read operation and a write operation.

6. The SRAM cell according to claim 5, wherein the boost voltage source is modulated to operate at a chip voltage and a boost voltage, the boost voltage being larger in magnitude than the chip voltage, and the boost voltage source operates provides the boost voltage prior to one of a read and write operation.

7. An SRAM ("Static Random Access Memory") cell comprising:
   a latch device for storing a state of the SRAM cell, the latch device comprising a first inverter and a second inverter, the first inverter and the second inverter configured in a cross-coupled arrangement, wherein each of the first inverter and second inverter includes a respective pull-up device and a pull-down device, the pull-up device operating to pull up a voltage at an output of a respective inverter and the pull-down device operating to pull down a voltage at an output of a respective inverter;
   an access device for performing a read and write operation, wherein the respective pull-up devices of the inverters are P-MOS transistors fabricated within at least one N well;
   a boost voltage source, wherein the boost voltage source is applied to the latch device, the boost voltage increasing a conductance of the latch device relative to a conductance of the access device, wherein a boost voltage is applied to the N well.

8. A method for performing fast reading and writing to an SRAM cell including a latch device and an access device comprising:

providing a boost voltage source, the boost voltage source increasing a conductance of the latch device in the SRAM cell relative to a conductance of the access device in the SRAM cell;

prior to one of a read operation and a write operation, applying the boost voltage source to a pull-up device in the latch device;

performing one of a read operation and a write operation on the SRAM cell.

9. The method according to claim 8, wherein the boost voltage source is modulated between a chip voltage and a boost voltage, the boost voltage being greater in magnitude than the chip voltage.

10. The method according to claim 8, wherein performing one of a read operation and a write operation further includes:

precharging a bitline pair associated with the SRAM cell;

associating a wordline associated with the SRAM cell.

11. An SRAM array comprising:

at least one SRAM cell arranged in an array configuration, each SRAM cell comprising:

a latch device for storing a state of the SRAM cell;

an access device for performing a read and write operation;

a plurality of wordlines, each wordline controlling at least one access device;

a plurality of bitline pairs, wherein each bitline pair is coupled to at least one SRAM cell through an access device;

a boost voltage source, wherein the boost voltage source is applied to at least one latch device, the boost voltage increasing a conductance of the at least one latch device relative to a conductance of the at least one respective access device.

12. The SRAM array according to claim 11, wherein the boost voltage source is modulated between a first voltage and a boost voltage.

13. An SRAM array comprising:

at least one SRAM cell arranged in an array configuration, each SRAM cell comprising:

a latch device for storing a state of the SRAM cell;

an access device for performing a read and write operation;

a plurality of wordlines, each wordline controlling at least one access device;

a plurality of bitline pairs, wherein each bitline pair is coupled to at least one SRAM cell through an access device;

a boost voltage source, wherein the boost voltage source is applied to at least one latch device, the boost voltage increasing a conductance of the at least one latch device relative to a conductance of at least one respective access device, and wherein the boost voltage source is modulated between a first voltage and a boost voltage;

decoding logic for generating a control signal to control the boost voltage source.

14. A method for writing to an SRAM cell comprising:

(a) precharging a bitline pair associated with the cell;

(b) modulating a voltage applied to a latch device of the cell;

(c) applying a signal to cause a write operation.

15. The method according to claim 14, wherein the voltage is modulated by reducing it from a previous value.

* * * * *